US 11,763,857 B2

(12) United States Patent
Chiu et al.

(10) Patent No.: US 11,763,857 B2
(45) Date of Patent: Sep. 19, 2023

(54) MEMORY DEVICE AND METHOD OF FORMING THE SAME

(71) Applicant: Taiwan Semiconductor Manufacturing Company, Ltd., Hsinchu (TW)

(72) Inventors: Jung-Piao Chiu, Kaohsiung (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 79 days.

(21) Appl. No.: 17/387,924

(22) Filed: Jul. 28, 2021

(65) Prior Publication Data

US 2022/0366941 A1    Nov. 17, 2022

Related U.S. Application Data

(60) Provisional application No. 63/188,476, filed on May 14, 2021.

(51) Int. Cl.

| G11C 5/06 | (2006.01) |
|---|---|
| H01L 25/065 | (2023.01) |
| G11C 13/00 | (2006.01) |
| H10B 63/00 | (2023.01) |
| H10N 70/00 | (2023.01) |

(52) U.S. Cl.
CPC .......... *G11C 5/063* (2013.01); *H01L 25/0652* (2013.01); *G11C 13/0026* (2013.01); *G11C 13/0028* (2013.01); *H10B 63/84* (2023.02); *H10N 70/011* (2023.02); *H10N 70/821* (2023.02)

(58) Field of Classification Search
CPC . G11C 5/063; G11C 13/0026; G11C 13/0028; H01L 25/0652; H01L 27/2481; H01L 45/122; H01L 45/16
USPC .......................................................... 365/63
See application file for complete search history.

(56) References Cited

U.S. PATENT DOCUMENTS

| 8,742,389 | B2 * | 6/2014 | Lee | .................. | H01L 27/249 |
|---|---|---|---|---|---|
|  |  |  |  |  | 438/102 |
| 9,099,177 | B2 * | 8/2015 | Sasago | ................ | H01L 27/2454 |
| 9,251,878 | B2 * | 2/2016 | Kim | .................... | G11C 11/4085 |
| 10,115,669 | B2 * | 10/2018 | Terada | ............... | H01L 27/2481 |
| 10,170,570 | B1 * | 1/2019 | Sonehara | ............. | H01L 23/528 |
| 10,410,720 | B2 * | 9/2019 | Iizuka | ............... | G11C 13/0004 |
| 10,748,965 | B2 * | 8/2020 | Miyazaki | ........... | H01L 45/1233 |
| 10,991,760 | B2 * | 4/2021 | Hong | ................. | H01L 27/0629 |

(Continued)

*Primary Examiner* — Viet Q Nguyen
(74) *Attorney, Agent, or Firm* — JCIPRNET

(57) ABSTRACT

A memory device includes transistors and a memory cell array disposed over and electrically coupled to the transistors. The memory cell array includes word lines, bit line columns, and data storage layers interposed between the word lines and the bit line columns. A first portion of the word lines on odd-numbered tiers of the memory cell array is oriented in a first direction, and a second portion of the word lines on even-numbered tiers of the memory cell array is oriented in a second direction that is angularly offset from the first direction. The bit line columns pass through the odd-numbered tiers and the even-numbered tiers, and each of the bit line columns is encircled by one of the data storage layers. A semiconductor die and a manufacturing method of a semiconductor structure are also provided.

20 Claims, 13 Drawing Sheets

(56) References Cited

U.S. PATENT DOCUMENTS

| | | | |
|---|---|---|---|
| 11,289,163 B2* | 3/2022 | Li | G11C 16/0475 |
| 11,335,422 B2* | 5/2022 | Aikawa | G11C 16/0433 |
| 11,386,950 B2* | 7/2022 | Park | H01L 27/1082 |
| 11,443,780 B2* | 9/2022 | He | G11C 7/1096 |
| 11,450,381 B2* | 9/2022 | Tanaka | G11C 16/26 |
| 11,475,947 B1* | 10/2022 | Fantini | G11C 13/004 |
| 11,476,254 B2* | 10/2022 | Yokoyama | H01L 27/2481 |
| 2018/0277202 A1* | 9/2018 | Iizuka | H01L 45/1233 |
| 2019/0080756 A1* | 3/2019 | Pellizzer | G11C 13/0007 |
| 2022/0013171 A1* | 1/2022 | Terai | H01L 45/06 |
| 2022/0139916 A1* | 5/2022 | Kwak | H01L 27/10891 |
| | | | 257/300 |
| 2022/0246607 A1* | 8/2022 | Chen | H01L 27/11556 |

* cited by examiner

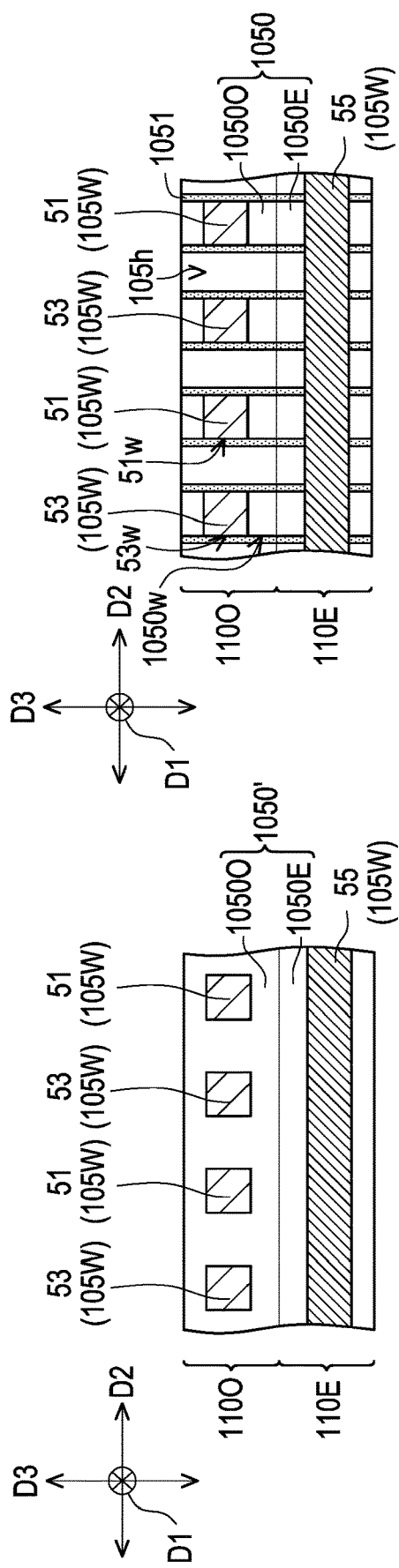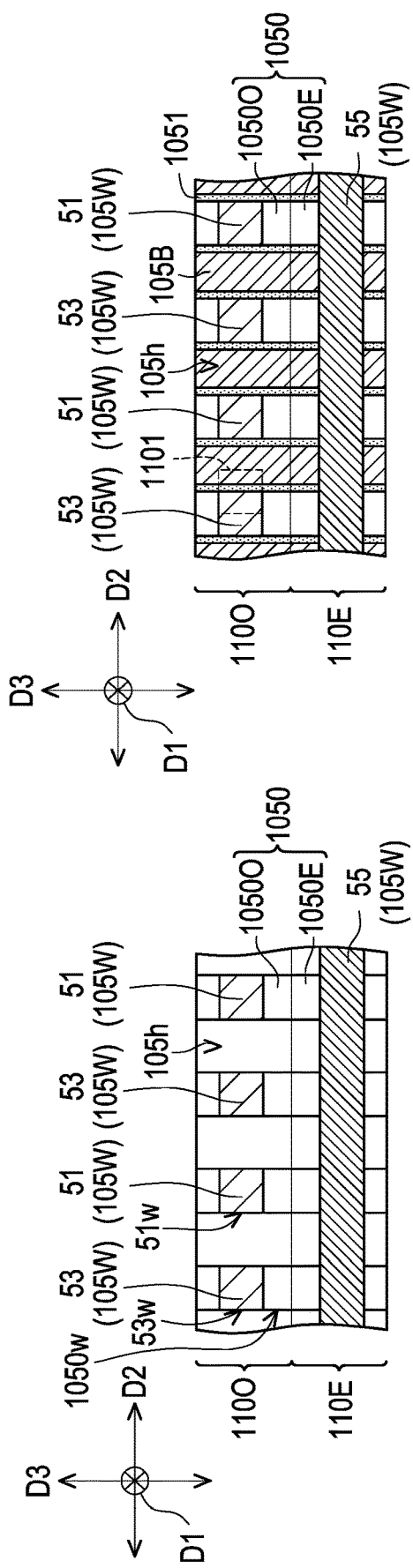

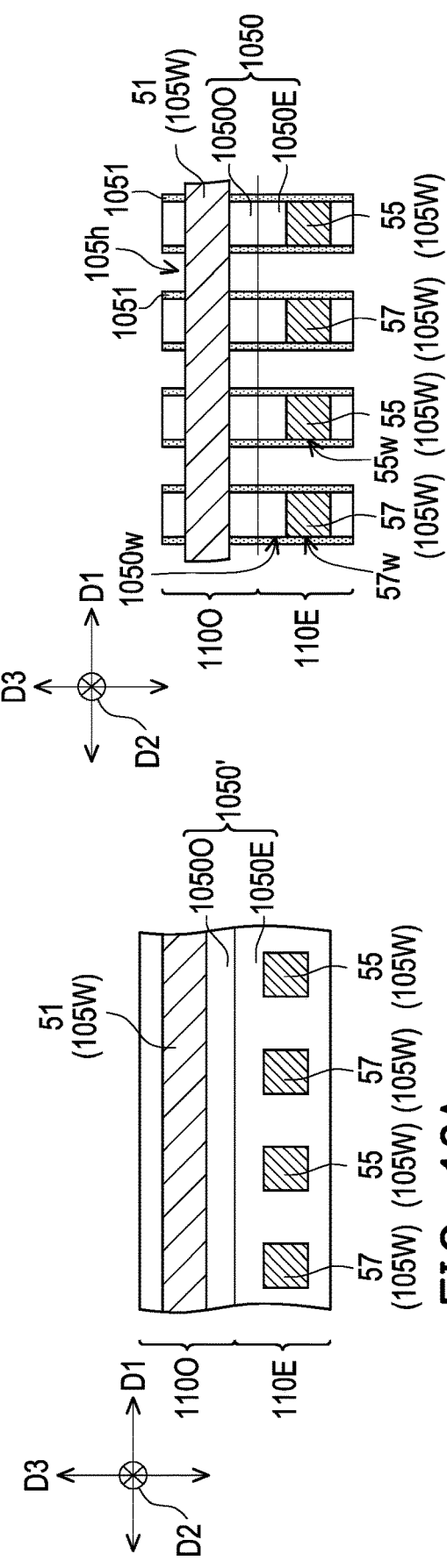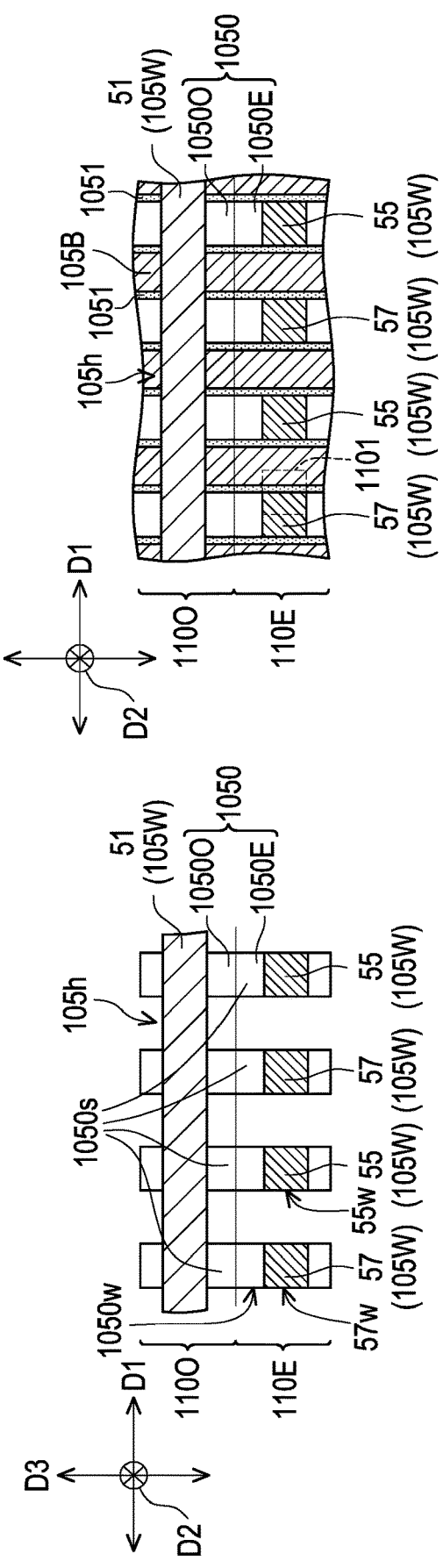

MEMORY DEVICE AND METHOD OF FORMING THE SAME

CROSS-REFERENCE TO RELATED APPLICATION

This application claims the priority benefit of U.S. provisional application Ser. No. 63/188,476, filed on May 14, 2021. The entirety of the above-mentioned patent application is hereby incorporated by reference herein and made a part of this specification.

BACKGROUND

Semiconductor devices are widely used in a variety of electronic applications, including radios, televisions, mobile phones, and personal computing devices, as examples. Memory devices are one type of semiconductor devices. As sizes of the memory devices continue to shrink, the pitch between memory cells also continues to shrink. Reduced pitch between memory cells results in a reduction of word line spacing. Reduced spacing between neighboring word lines increase the coupling effect which, in turn, reduces word line speed and integrated circuit performance. As such, there is a continuous need to provide reliable memory device with minimal size and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-9D and FIGS. 10A-10D are schematic partial cross-sectional views of intermediate stages of forming a memory cell array of a memory device taken along different directions according to some embodiments.

DETAILED DESCRIPTION

Figure 1:
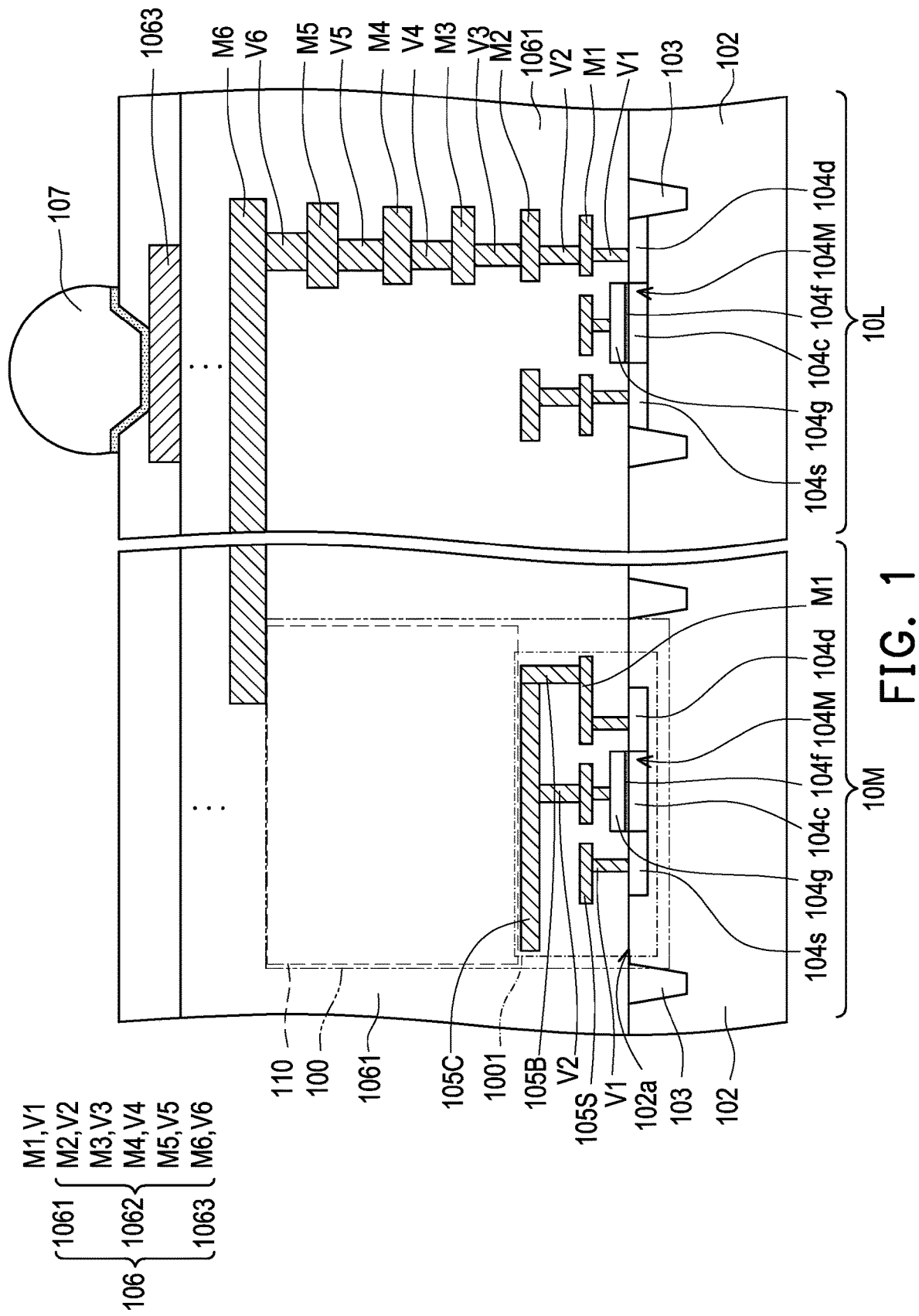
FIG. 1 is a schematic cross-sectional view of a semiconductor die according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
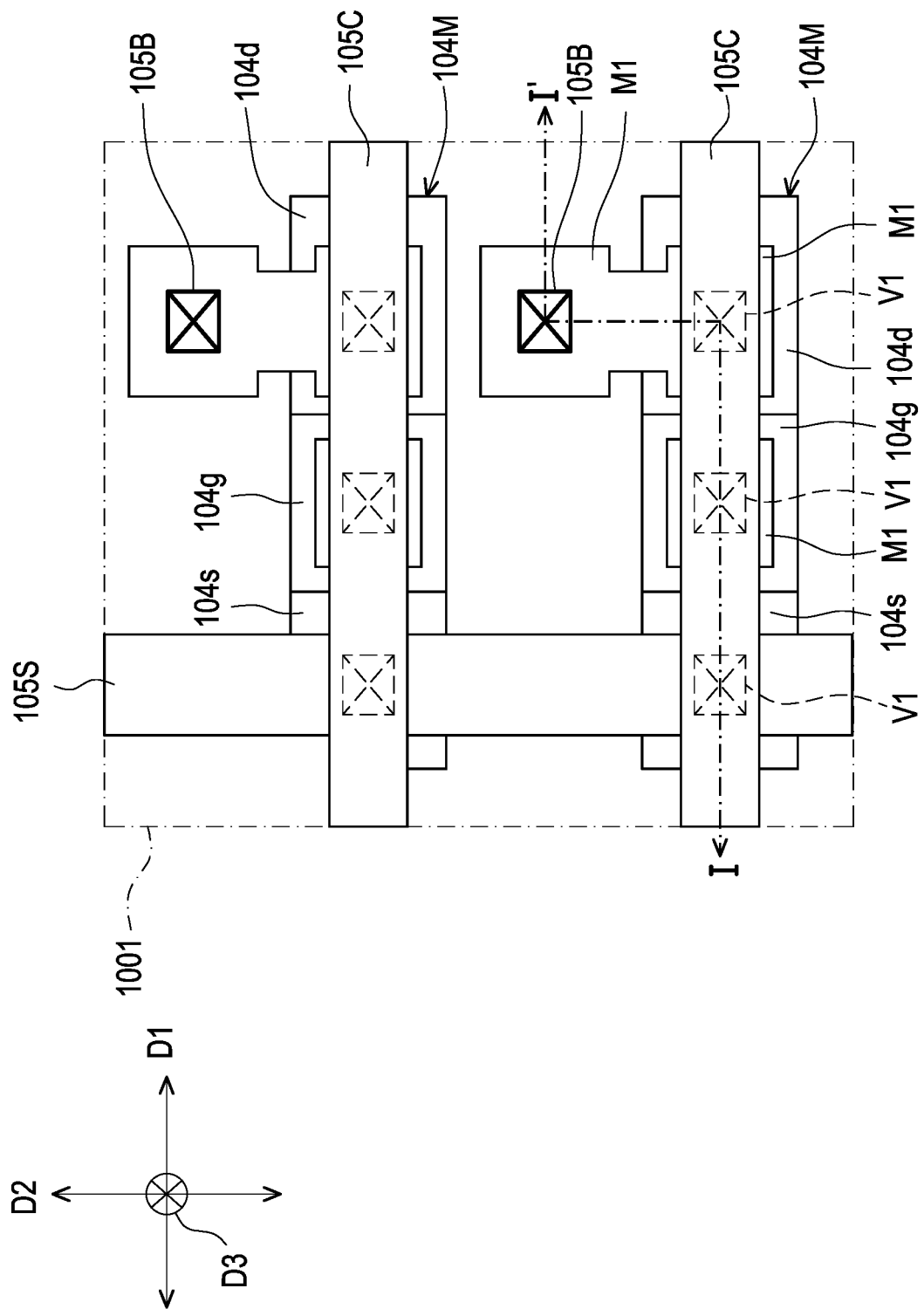
FIG. 2 is a schematic top-down view of a structure represented in FIG. 1 by the dashed box labeled "1001" according to some embodiments.

FIG. 1 is a schematic cross-sectional view of a semiconductor die according to some embodiments and FIG. 2 is a schematic top-down view of a structure represented in FIG. 1 by the dashed box labeled "1001" according to some embodiments, where the structure in the dashed box labeled "1001" shown in FIG. 1 is a cross-sectional view taken along line I-I' outlined in FIG. 2. It is appreciated that FIG. 1 is a simplified view, and some features in a semiconductor die are omitted for clarity of illustration.

Referring to FIG. 1, a semiconductor die 10 includes a logic region 10L and a memory region 10M. The memory region 10M may be disposed at an edge of the logic region 10L, or the logic region 10L may surround the memory region 10M. In some embodiments, the logic region 10L and the memory region 10M are formed over a same semiconductor substrate 102. The semiconductor substrate 102 may include semiconductor materials (e.g., silicon, germanium, etc.), a compound semiconductor (e.g., SiC, GaAs, GaP, GaN, InP, InAs, etc.), an alloy semiconductor (e.g., SiGe, GaAsP, AlInAs, AlGaAs, GaInAs, GaInP, GaInAsP, etc.), combinations thereof, and/or the like. Other suitable substrate (e.g., a multi-layered substrate, a gradient substrate, or a semiconductor-on-insulator substrate) may be used.

In some embodiments, a plurality of devices (e.g., 104M and 104L) may be formed at the active surface 102a of the semiconductor substrate 102. The devices (e.g., 104M and 104L) may be or may include active devices (e.g., transistors, diodes) and/or passive devices (e.g., capacitors, resistors), and the devices may be formed by any suitable formation method. In some embodiments, the devices (e.g., 104M and 104L) are interconnected to respectively form the memory devices 100 and logic devices in the semiconductor die 10. In some embodiments, a plurality of isolation structures 103 may be disposed over the active surface 102a of the semiconductor substrate 102. The isolation structures 103 may be disposed around the active areas of the devices (e.g., 104M and 104L) to electrically isolate neighboring active areas from one another. The isolation structures 103 may be referred to as shallow trench isolation (STI) structure, in accordance with some embodiments. For example, front-end-of-line (FEOL) processes are performed to form the isolation structures 103 and the devices (104M and 104L).

In some embodiments, the device 104M formed in the memory region 10M has a source electrode 104s, a drain electrode 104d, a channel region 104c disposed between the source electrode 104s and the drain electrode 104d, and a gate electrode 104g disposed over the channel region 104c. The device 104L formed in the logic region 10L may have the source/drain electrodes 104s/104d, the gate electrode 104g, and the channel region 104c arranged in the same manner as the device 104M. In some embodiments, a gate dielectric 104f is disposed between the channel region 104c and the gate electrode 104g. The gate dielectric 104f may include a single layer or a multi-layer structure and may include an interfacial dielectric material, a high-k dielectric material, and/or the like.

With continued reference to FIG. 1, an interconnect structure 106 may be formed over the semiconductor substrate 102 and interconnects the devices (e.g., 104M and 104L) to form integrated circuits in each of the logic region 10L and the memory region 10M. The interconnect structure 106 may include one or more dielectric layer(s) 1061 and a plurality of conductive features 1062 embedded in the dielectric layer 1061. The dielectric layer 1061 may include Inter-Layer Dielectric (ILD), Inter-Metal Dielectric (IMD), passivation materials, and/or the like. The conductive features 1062 may include metal lines (e.g., M1, M2, M3, M4, M5, and M6) and metal vias (e.g., V1, V2, V3, V4, V5, and V6). For example, the conductive features 1062 include conductive material(s) such as copper, aluminum, nickel, tungsten, alloys thereof, and/or the like. It should be appreciated that the illustrated interconnect structure 106 is merely an example, and more (or less) elements may be included. For example, middle-end-of-line (MEOL) processes are performed to form the metal vias (V1) landing on the electrode regions (e.g., 104g, 104s, and 104d) of the devices (104M and 104L), and back-end-of-line (BEOL) processes are performed to form multilayered interconnect features that interconnects various elements formed by the FEOL and MEOL processes.

In some embodiments, a memory cell array 110 of the memory device 100 is formed by the BEOL processes. For example, the memory cell array 110 is embedded in the dielectric layer 1061 of the interconnect structure 106 and electrically coupled to the device 104M. In some embodiments, the memory cell array 110 includes a plurality of memory cells (labeled as 1101 in FIG. 4) arranged in rows and columns. The memory cell array 110 may be formed corresponding to those conductive features 1062 of the logic circuit in the logic region 10L. The memory cell array 110 may be formed after (or before) forming the conductive features 1062 of the logic circuit in the logic region 10L. Alternatively, the formations of the memory cell array 110 and the conductive features 1062 in the logic region 10L are performed at the same steps. In some embodiments, the conductive feature 1062 (e.g., the metal line M6 or other metal line/via on any level) connected to the memory cell array 110 interconnects to the logic circuit in the logic region 10L. The conductive feature 1062 (e.g., the metal line M6 or other metal line/via on any level) in the logic region 10L may be connected to the memory cell array 110 from the top of the memory cell array 110 or from the side(s) of the memory cell array 110. The detailed structure of the memory cell array 110 will be discussed later in accompanying with FIGS. 4-6.

Referring to FIG. 2 and with reference to FIG. 1, the devices 104M may be disposed side by side (e.g., in parallel) and arranged in an array. The devices 104M are operable for operations (e.g., read, write, or erase) of the memory cell array 110. In some embodiments, the gate electrode 104g of each device 104 is electrically coupled to a respective control line 105C, the source electrode 104s of each device 104 is electrically coupled to a respective source line 105S, and the drain electrode 104d of each device 104 is electrically coupled to a respective bit line 105B. In some embodiments, the control line 105C is disposed above the gate electrode 104g and may be coupled to the gate electrode 104g though the metal vias (V1 and V2) and the metal line M1. The source line 105S may be coupled to the source electrode 104s through one of the metal vias V1, and the bit line 105B may be coupled to the drain electrode 104d through one of the metal vias V1 and one of the metal lines M1.

In some embodiments, the control line 105S extends in a first direction D1, the source line 105S extends in a second direction D2, and the bit line 105B extends in a third direction D3. For example, the first direction D1 is substantially orthogonal to the second direction D2, and the third direction D3 is substantially orthogonal to the first direction D1 and the second direction D2. The first direction D1 may be the lengthwise direction of the control line 105C, the second direction D2 may be the lengthwise direction of the source line 105S, and the third direction D3 may be the height-wise direction of the bit line 105B. In some embodiments, the bit line 105B is referred to as a vertical bit line or a bit line column in the memory cell array 110. In the top-down view, the source electrode 104s, the gate electrode 104g, and the drain electrode 104d may be sequentially arranged along the first direction D1, and the control line 105C extending in the first direction D1 may be disposed right above the source electrode 104s, the gate electrode 104g, and the drain electrode 104d. The device 104M may be referred to as a planar transistor, given its arrangement. In some embodiments, the control line 105C extends to couple the gate electrodes 104g of multiple devices 104M arranged in a row along the first direction D1. The source line 105S may extend to couple the source electrodes 104s of multiple devices 104M arranged in a column along the second direction D1. Depending on the embodiments, the source line 105S may span the whole (or a portion) of the device array. In some embodiments, the source line 105S is electrically coupled to ground. The details of the memory cell array 110 will be discussed later in other embodiments.

Referring back to FIG. 1, the interconnect structure 106 may include bump pads 1063 formed on the topmost level of the interconnecting layers. For example, the bump pads 1063 are under bump metallization (UBM) pads which includes gold, silver, copper, nickel, tungsten, aluminum, palladium and/or alloys thereof. In some embodiments, the semiconductor die 10 includes a plurality of conductive bumps 107 formed on the bump pads 1063 and electrically coupled to the devices (e.g., 104L and 104M) through the conductive features 1062 of the interconnect structure 106.

The material of the conductive bump 107 may include solder, copper, nickel, gold a combination thereof, and/or the like.

Figure 3:
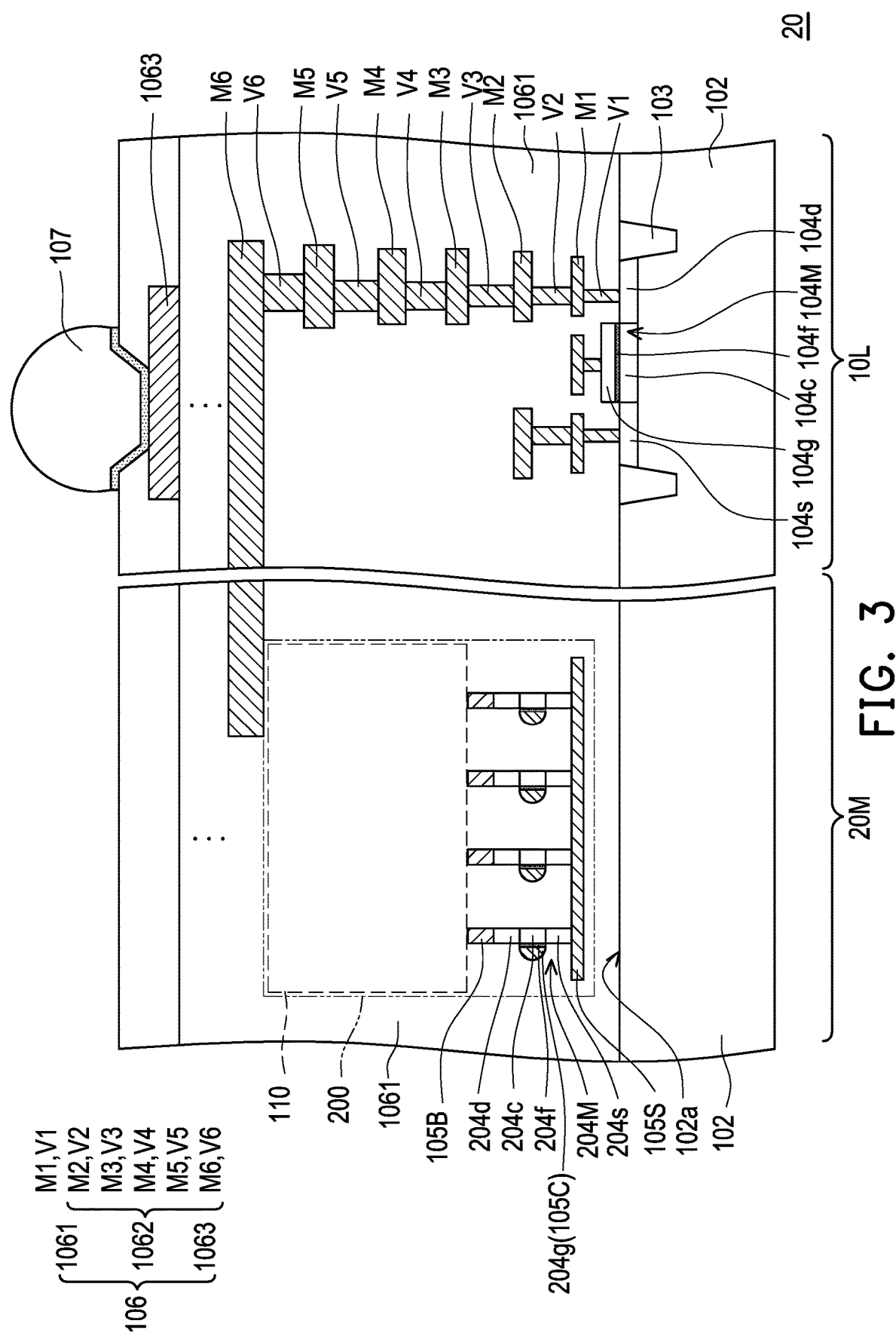
FIG. 3 is a schematic cross-sectional view of a semiconductor die according to some embodiments.

FIG. 3 is a schematic cross-sectional view of a semiconductor die according to some embodiments. Items of FIG. 3 that are the same items in FIG. 1 are indicated by the same reference numerals, and the details thereof are not repeated for the sake of brevity.

Referring to FIG. 3, a semiconductor die 20 includes the logic circuit formed in the logic region 10L and a memory device 200 formed in a memory region 20M. The memory device 200 may be embedded in the interconnect structure 106 for data storage and transmission. In some embodiments, the device 104L is formed in the logic region 10L through the FEOL processes, and the devices 204M of the memory device 200 in the memory region 20M are formed by the BEOL processes. In some embodiments, the source line 105S is formed over the active surface 102a of the semiconductor substrate 102. For example, the source line 105S in the memory region 20M and the metal lines M1 in the logic region 10L are formed on the same level. Alternatively, the source line 105S may be formed on any level of the metal lines in the interconnect structure 106. A plurality of the devices 204M may be arranged in a row on the respective source line 105S and may be electrically coupled to the memory cell array 110 which is formed over the devices 204M. The details of the memory cell array 110 will be discussed later in other embodiments.

In some embodiments, the respective device 204M includes a source electrode 204s formed on the source line 105S, a drain electrode 204d stacked over the source electrode 204s, a channel region 204c vertically sandwiched between the source electrode 204s and the drain electrode 204d, and a gate electrode 204g laterally disposed on the channel region 204c. In some embodiments, a gate dielectric 204f is disposed between the channel region 204c and the gate electrode 204g. For example, the gate electrode 204g, the gate dielectric 204f, and the channel region 204c are arranged along the lengthwise direction of the source line 105S. In some embodiments, each of the bit lines 105B is disposed on and electrically connected to one of the drain electrode 204d of the devices 204M. The source electrode 204s, the channel region 204c, and the drain electrode 204d are arranged along the height-wise direction of the bit line 105B. The device 204M may be referred to as a vertical transistor or a column selection transistor, given its arrangement in the memory device 200. In some embodiments, the gate electrode 204g is elongated in a direction that is orthogonal to the lengthwise direction of the source line 105S and the height-wise direction of the bit line 105B. For example, the control line 105C serves as the gate for the devices 204M.

Figure 4:
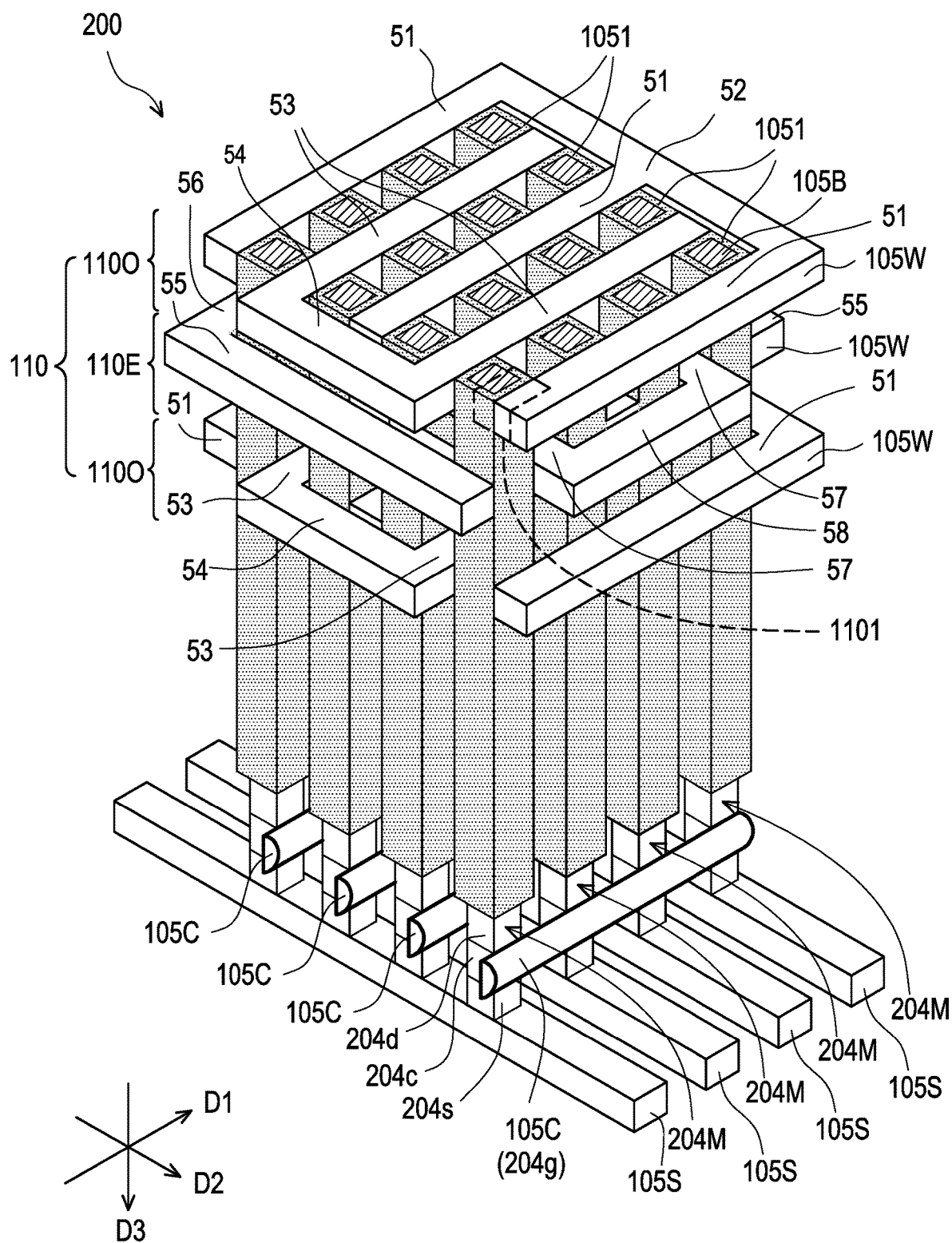
FIG. 4 is a schematic perspective view of a memory device according to some embodiments.
Figures 5A, 5B:
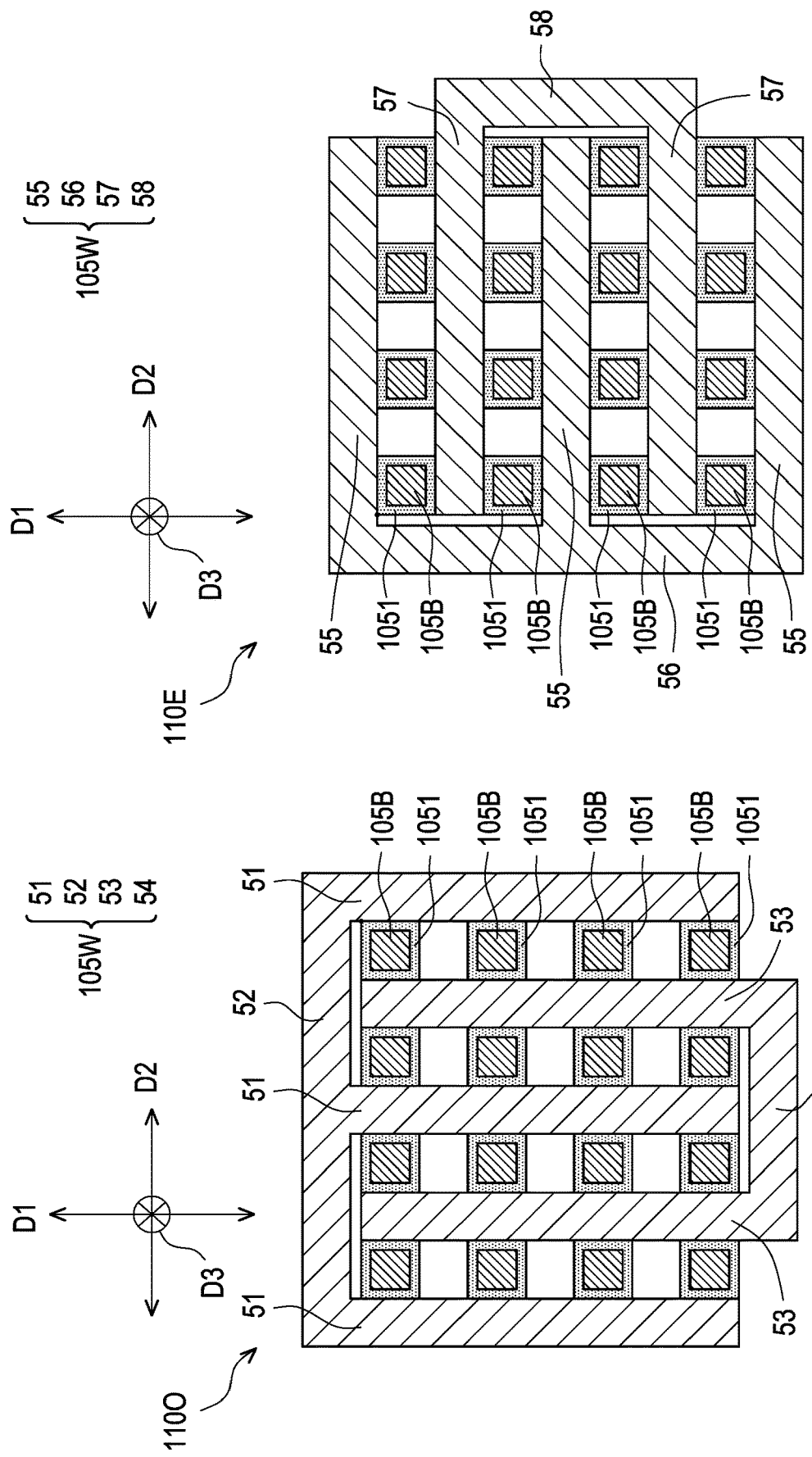
FIG. 5A is a schematic top view of an odd-numbered tier of a memory cell array of a memory device according to some embodiments.
FIG. 5B is a schematic top view of an even-numbered tier of a memory cell array of a memory device according to some embodiments.

FIG. 4 is a schematic perspective view of a memory device according to some embodiments, FIG. 5A is a schematic top view of an odd-numbered tier of a memory cell array and FIG. 5B is a schematic top view of an even-numbered tier of a memory cell array, in accordance with some embodiments. The memory device in FIG. 4 may be the memory device 200 described in FIG. 3, and the like numeral references indicate the like elements. It should be noted that some elements (such as the dielectric layer(s) that covers the memory device) are not shown in FIGS. 4, 5A, and 5B for clarity of illustration.

Referring to FIG. 4 and with reference to FIG. 3, the memory device 200 includes the devices 204M arranged in an array on the source lines 105S. Although the devices 204M arranged in a 4-by-4 array are illustrated, other arrangement of the device array may be possible depending on product requirements. In some embodiments, the source electrodes 204s of a series of the devices 204M arranged in the second direction D2 are disposed on the same source line 105S. The control line 105C serving as the gate electrode may be coupled to a series of the devices 204M arranged in the first direction D1. The memory cell array 110 may be disposed over and electrically coupled to the array of the devices 204M. In some embodiments, the memory cell array 110 includes a plurality of tiers (e.g., 110O and 110E) stacked upon and spaced apart from one another to form a three-dimensional array. The bit lines 105B may pass through all of the tiers including odd-numbered tiers 110O and even-numbered tiers 110E in the third direction D3 to be coupled to the drain electrodes 204d of the devices 204M. It should be appreciated that a three-tier memory cell array is shown for illustrative purposes only, and the memory cell array may have more than three tiers (or less than three tiers) depending on embodiments. Each tier includes a plurality of cells that may store one bit of information (e.g., a bit value "0" or a bit value "1"), and each cell may be referred to as a bit cell or a memory cell 110I in accordance with some embodiments. For example, each memory cell 110I is connected to one of the bit lines 105B and one of a plurality of word lines 105W.

With continued reference to FIG. 4, the memory cell array 110 may include a plurality of data storage layers 1051 interposed between the word lines 105W and the bit lines 105B. Each of the bit lines 105B may be surrounded by one of the data storage layers 1051. The data storage layers 1051 may be or may include any suitable memory material depending on product requirements. The respective data storage layer 1051 may be a single layer or a multi-layer structure for lower sneak current. In some embodiments where a resistive random-access memory (RRAM) device is provided, the data storage layers 1051 may include resistive materials (e.g., metal oxide, polymer, or the like) that are capable of adjusting the resistance to represent logic "0" or logic "1". In some embodiments, the data storage layers 1051 may include phase change random access memory (PCRAM) materials that are capable of switching between crystalline and amorphous to represent the stored data. In some embodiments, the data storage layers 1051 may include conductive-bridging random access memory (CBRAM) materials. In some embodiments where a magneto-resistive random-access memory (MRAM) device is provided, a magnetic layer having a magnetic moment that is switchable may serve as the data storage layers 1051. In some embodiments where a ferroelectric random-access memory (FeRAM) device is provided, the data storage layers 1051 may include ferroelectric materials (e.g., hafnium based dielectric materials and/or the like) that are capable of switching between two different polarization directions by applying an appropriate voltage differential across the data storage layer.

With continued reference to FIG. 4 and referring to FIGS. 5A-5B, a plurality of word lines 105W on the odd-numbered tiers 110O (e.g., the first tier, the third tier, etc.) and a plurality of word lines 105W on the even-number tiers 110E (e.g., the second tier, the fourth tier, etc.) may have different orientations. In some embodiments, the word lines 105W have a comb-like configuration on each tier in the top-down view. For example, the word lines 105W on the odd-numbered tiers 110O of the memory cell array 110 include a first portion and a second portion, where the first portion includes a plurality of first branch portions 51 connected together through a first common connection 52, and the second portion includes a plurality of second branch portions 53 connected together through a second common connection 54. The first and second branch portions (51 and 53) may be interleaved with one another and extend in the first direction D1. The first and second common connections (52 and 54) may be in parallel and extend in the second direction D2. As shown in the top-down view of FIG. 5A, the bit lines 105B separately arranged in a column along the first direction D1 may be surrounded by the data storage layers 1051 and may be interposed between two neighboring first and second branch portions (51 and 53). In some embodiments, the first and second common connections (52 and 54) are not in direct contact with the data storage layers 1051 and the bit lines 105B.

The word lines 105W on the even-numbered tiers 110E may be oriented in a direction that is angularly offset from a direction of the word lines 105W on the odd-numbered tiers 110O by an angle (e.g., about 90 degrees or about 270 degrees). For example, the word lines 105W on the even-numbered tiers 110E include a third portion and a fourth portion, where the third portion includes a plurality of third branch portions 55 connected together through a third common connection 56, and the second portion includes a plurality of fourth branch portions 57 connected together through a fourth common connection 58. The third and fourth branch portions (55 and 57) of the word lines 105W may be interleaved with one another so that a set of three consecutive branch portions are in different common connections. The third and fourth branch portions (55 and 57) may be elongated in the second direction D2 and spaced apart in the first direction D1 between the bit lines 105B. The third and fourth common connections (56 and 58) may be in parallel and extend in the first direction D1, and the third and fourth common connections (56 and 58) are not in direct contact with the data storage layers 1051 that surrounds the bit lines 105B.

It is understood that as the memory cells in the memory cell array continue to shrink, the pitch between the neighboring memory cells also continues to shrink. Reduced pitch between the neighboring memory cells may result in a reduction of word line spacing between neighboring tiers. Reduced spacing between word lines may call for reduced spacing between neighboring word lines on adjacent tiers. It is also understood that reduced spacing between neighboring word lines on adjacent tiers may increase the coupling effect and cause reduced word line speed and integrated circuit performance. The memory device 200 having the memory cell array 110 that includes the word lines on the odd-numbered tiers 110O angularly offset from the word lines on the even-numbered tiers 110E is configured to reduce the cell-to-cell spacing between adjacent tiers, thereby reducing the coupling effect that might occur. For example, as compared with the memory cell array having the aligned word line configurations on all tiers, the cell-to-cell spacing between adjacent tiers in the memory cell array 110 may be greater than the cell-to-cell spacing in the memory cell array with the aligned word line configurations on all tiers.

Figure 6:
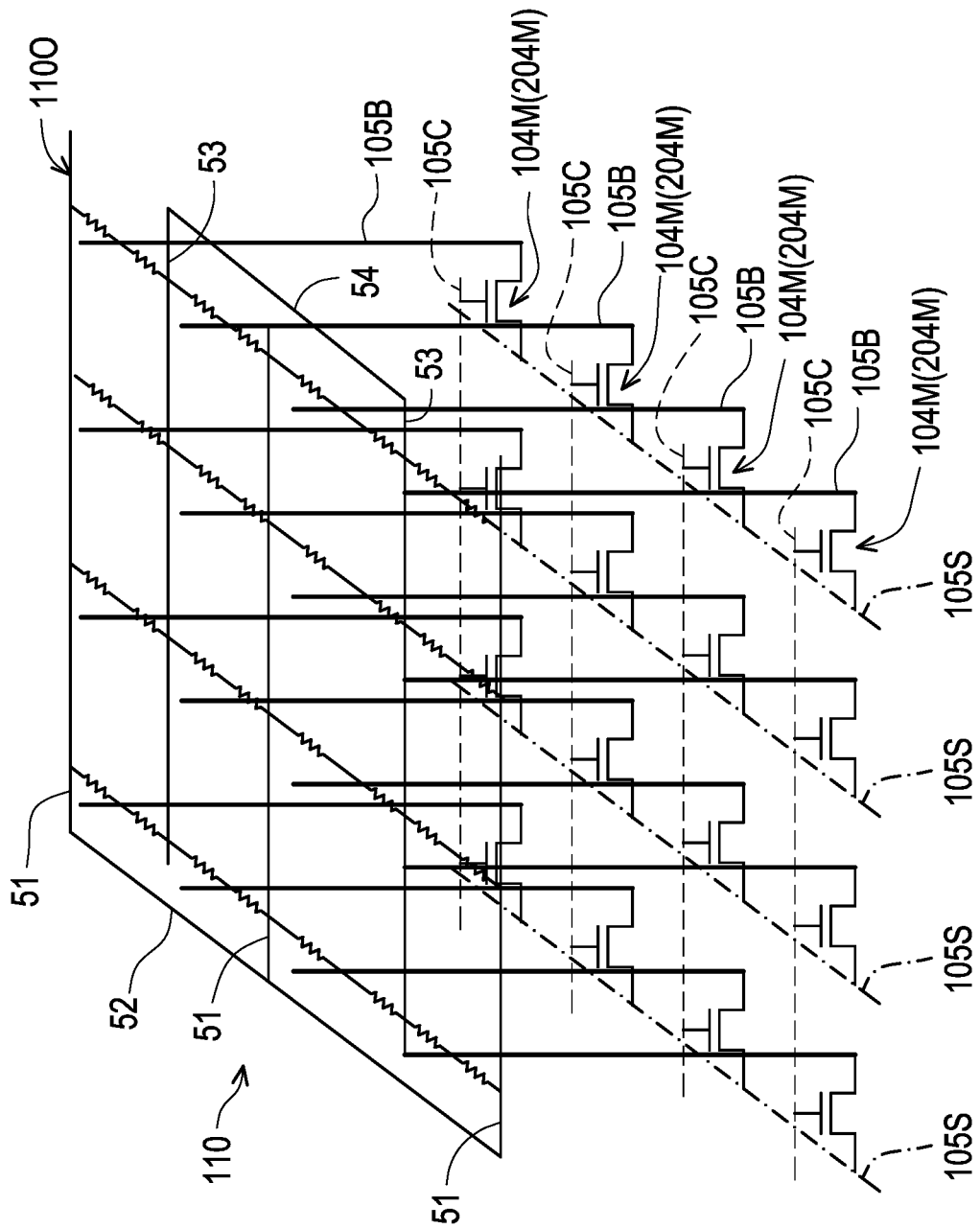
FIG. 6 is a schematic circuit diagram of a tier of a memory cell array of a memory device according to some embodiments.

FIG. 6 is a schematic circuit diagram of a tier of a memory cell array of a memory device according to some embodiments. It should be understood that the memory device in FIG. 6 depicting planar transistors connected to vertical bit lines is merely an example, the memory device may include vertical transistors depending on embodiments. Although the bit lines are drawn as vertical lines and described as such, and the word lines and the source lines are drawn as horizontal lines and described as such, such is for ease of description only and refers to the orientation described in FIG. 4 only. The illustrated tier of the memory cell array in FIG. 6 may be the odd-numbered tier. For the even-numbered tier, the configuration of the word lines may be rotated 90 degrees, in accordance with some embodiments. It should be understood that the operations on the even-numbered tiers in the memory cell array may be similar to the operations on the odd-numbered tiers. Throughout the various views and illustrative embodiments, like reference numbers are used to designate like elements.

Referring to FIG. 6, a plurality of the devices 104M (or 204M) are arranged in an array. Although a 4-by-4 array of the devices is illustrated, other arrangement of the devices may be possible depending on product requirements. The devices 104M (or 204M) are coupled to the memory cells to control access to the memory cells during operations (e.g., read, write, and/or erase). The devices may be transistors and may be referred to as select transistors or access transistors. The memory cells may be respectively associated with an address defined by an intersection of one of the branch portions of the word lines 105W and the corresponding bit line 105B.

In some embodiments, on the odd-numbered tier 110O of the memory cell array 110, the first and second branch portions (51 and 53) are connected to the data storage layers 1051 (as labeled in FIG. 5A) that are in turn connected to the corresponding bit lines 105B. The device 104M (or 204M) may be coupled to each individual bit line 105B in one-to-one correspondence. In some embodiments, one of the control lines 105C is coupled to the corresponding bit lines 105B arranged in a row in the first direction D1. The control lines 105C may be independent controllable. For example, the control lines 105C coupled to the first and second branch portions (51 and 53) are separate so that the first and second branch portions (51 and 53) may individually be selected. The control lines 105C may be referred to as select lines or select gate lines, and the source lines 105S may be referred to as horizontal bit lines. In some embodiments, by selectively applying signals to the word lines 105W, the bit lines 105B, and the source lines 105S, operations (e.g., read, write, and erase) may be performed on selected ones of the memory cells.

FIGS. 7A-7D are schematic partial top views of intermediate stages in the formation of an odd-numbered tier (labeled as 110O in FIG. 4) of a memory cell array of a memory device according to some embodiments. Although FIGS. 7A-7D are described as a series of steps, it should be appreciated that some steps that are described may be omitted in whole or in part, and like reference numbers are used to designate like elements throughout the various views.

Figure 7A:
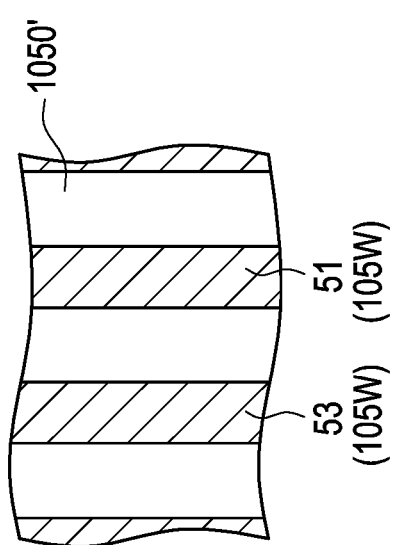
FIGS. 7A-7D are schematic partial top views of intermediate stages in the formation of an odd-numbered tier of a memory cell array of a memory device according to some embodiments.

Referring to FIG. 7A, the word lines 105W on the odd-numbered tier may be formed in a dielectric material 1050'. It should be understood that FIG. 7A is a partial view, the word lines 105W on the odd-numbered tier including the first and second branch portions (51 and 53) and the first and second common connections (labeled as 52 and 54 in FIG. 5A) are formed at this step. The dielectric material 1050' may include one or more low-k dielectric materials, such as silicon nitride, silicon oxide, silicon oxynitride, and/or the like. The word lines 105W on the odd-numbered tier may include conductive materials (e.g., copper, titanium, titanium nitride, tantalum, tantalum nitride, tungsten, ruthenium, aluminum, combinations thereof, or the like) and may be formed through any suitable process, such as deposition, damascene, the like, or combinations thereof. In some embodiments, the formation of the word lines 105W and the formation of the conductive features (e.g., metal lines and metal vias shown in FIG. 1 or 3) of the interconnect structure are separately performed. In some embodiments, the formation of the word lines 105W is compatible with the interconnect fabrication processes. For example, the dielectric material 1050' is a part of the dielectric layer (labeled as 1061 in FIG. 1 or 3) in the interconnect structure.

Figure 7B:
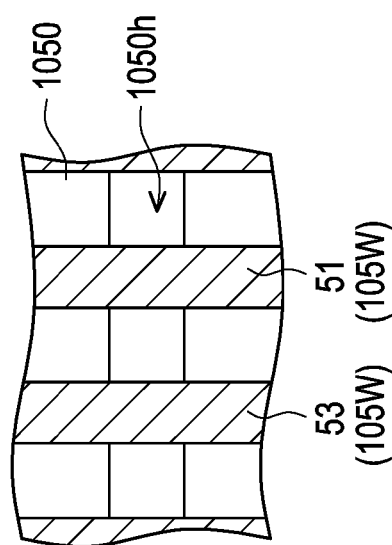

Referring to FIG. 7B and with reference to FIG. 7A, a portion of the dielectric material 1050' may be removed to form a dielectric layer 1050 having a plurality of holes 1050h. The step of forming the holes 1050h may be performed after the formation of alternating layers of dielectric and the word lines. The tier number of the word lines is dependent upon the design of the memory cell array and construes no limitation in the disclosure. In the top-down view, the holes 1050h may be in rectangular shape. It should be understood that the holes 1050h may have any suitable top-view shapes depending on product and process requirements. The holes 1050h may be formed through any suitable etching process, such as a dry etch (e.g., a reactive ion etch (RIE), neutral beam etch (NBE), the like), a wet etch, the like, or a combination thereof. For example, the holes 1050 are formed between the first and second branch portions (51 and 53) that are alternately arranged. In some embodiments, a plurality of the holes 1050 may be formed along the lengthwise direction of the first and second branch portions (51 and 53) and separated from one another. For example, each of the holes 1050h accessibly expose at least a portion of the drain electrode of one of the devices (e.g., 104M in FIG. 1 or 204M in FIG. 2) for coupling the subsequently formed bit line columns.

Figure 7C:
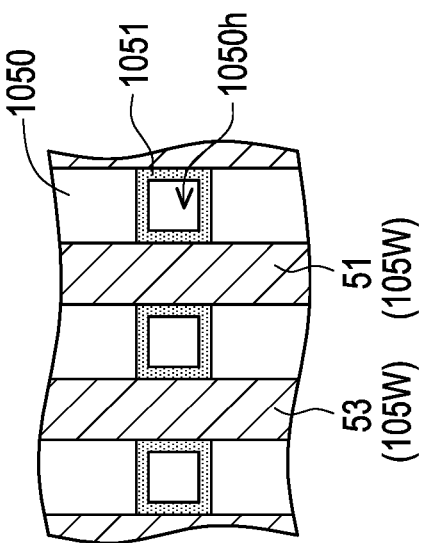

Referring to FIG. 7C, the data storage layers 1051 may be formed in the holes 1050h. For example, the respective data storage layer 1051 is deposited directly lining the inner sidewalls of the dielectric layer 1050 that define each hole 1050h. In the top-down view, two opposing sides (e.g., the left side and the right side) of the respective data storage layer 1051 are in direct contact with the neighboring first and second branch portions (51 and 53). The material(s) of the data storage layer may depend on the type of memory device as mentioned in preceding paragraphs related to FIG. 4. For example, the materials of the data storage layer 1051 may be formed by acceptable deposition processes such as chemical vapor deposition (CVD), atomic layer deposition (ALD), physical vapor deposition (PVD), plasma enhanced CVD (PECVD), or the like. In some embodiments, an acceptable etch process may be performed to remove excess material of the data storage layer from the drain electrodes of the devices so that the drain electrodes are accessibly exposed after the formation of the data storage layers 1051.

Figure 7D:
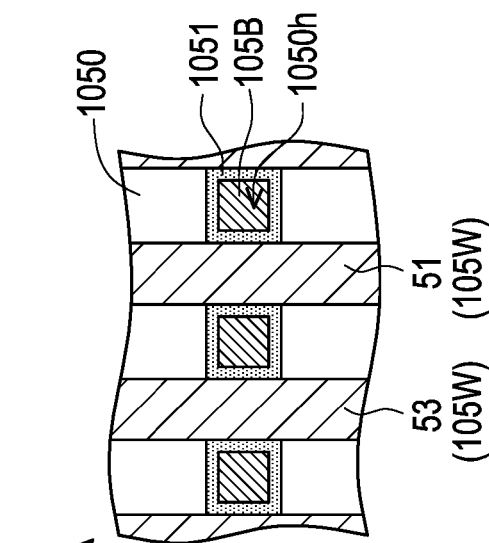

Referring to FIG. 7D, conductive material(s) may be formed in the holes 1050h to form the bit lines 105B. The conductive material(s) may include copper, titanium, titanium nitride, tantalum, tantalum nitride, tungsten, ruthenium, aluminum, combinations thereof, or the like, which may be formed using, for example, CVD, ALD, PVD, PECVD, or the like. In some embodiments, after deposition of the conductive material(s), a planarization (e.g., chemical mechanical polishing (CMP), etching, grinding, a combination thereof, or the like) may be performed to remove excess portions of the conductive material, thereby forming conductive columns in the holes 1050h that serve as the bit lines 105B.

FIGS. 8A-8D are schematic partial top views of intermediate stages in the formation of an even-numbered tier (labeled as 110E in FIG. 4) of a memory cell array of a memory device according to some embodiments. Unless specified otherwise, the materials and the formation methods of the elements in these embodiments are essentially the same as the like elements, which are denoted by like reference numerals in the embodiments shown in FIGS. 7A-7D. The details regarding the materials of the elements may thus be found in the discussion of the embodiments shown in FIGS. 7A-7D.

Figure 8C:
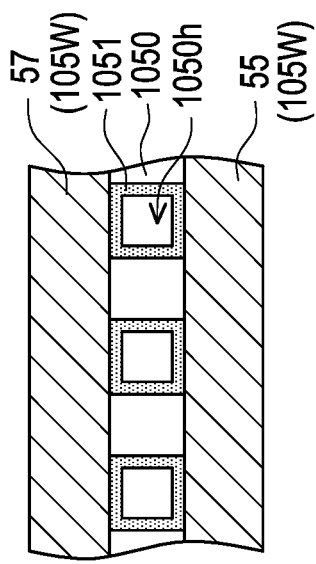
FIGS. 8A-8D are schematic partial top views of intermediate stages in the formation of an even-numbered tier of a memory cell array of a memory device according to some embodiments.
Figure 8D:
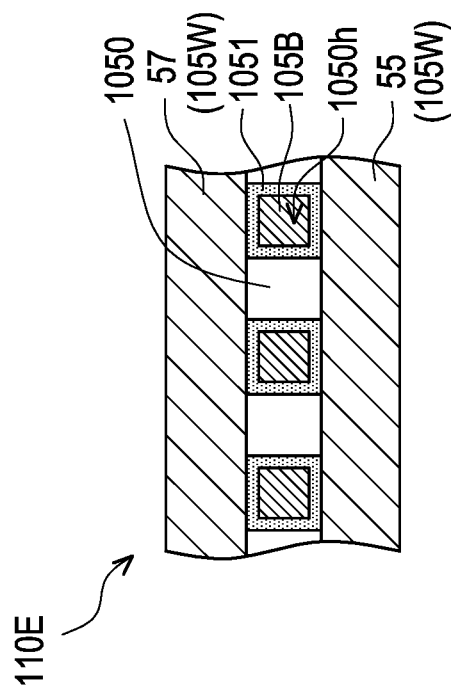
Figure 8A:
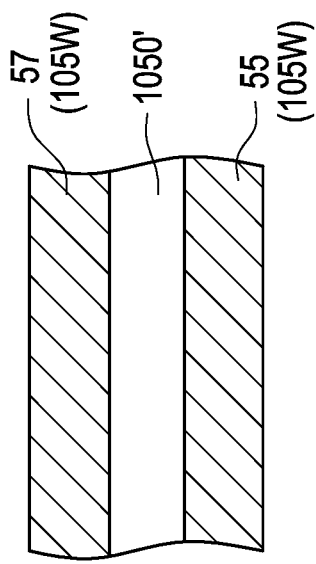

Referring to FIG. 8A, the word lines 105W on the even-numbered tier may be formed in the dielectric material 1050'. It should be understood that FIG. 8A is a partial view, the word lines 105W on the even-numbered tier including the third and fourth branch portions (55 and 57) and the first and second common connections (labeled as 56 and 58 in FIG. 5B) are formed at this step. The forming process and the material of the word lines 105W on the even-numbered tier may be similar to those of the word lines 105W on the odd-numbered tier, except that the orientation of the word lines 105W on the even-numbered tier is different from the orientation of the word lines 105W on the odd-numbered tier (see FIGS. 5A-5B). The word lines 105W on the odd-numbered tier and the word lines 105W on the even-numbered tier may be alternately formed in the dielectric material 1050'. For example, the word lines 105W on the odd-numbered tier is first formed in the dielectric material 1050', and then the word lines 105W on the even-numbered tier is formed in the dielectric material 1050' and above the word lines 105W on the odd-numbered tier. The steps may be repeated several times to obtain a predetermined number of the tiers.

Figure 8B:
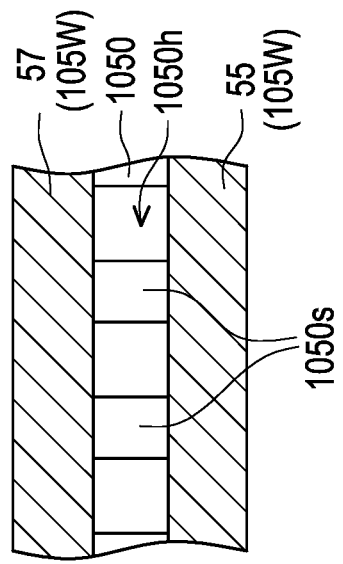

Referring to FIG. 8B and with reference to FIG. 8A, the portions of the dielectric materials 1050' are removed to form the dielectric layer 1050 with the holes 1050h. The step in FIG. 8B may correspond to the step described in FIG. 7B. As mentioned above, the step of forming the holes 1050h may be performed after the formation of alternating layers of dielectric and the word lines. In the top view, the holes 1050h are formed between two adjacent third and fourth branch portions (55 and 57) and arranged in the lengthwise direction of the third and fourth branch portions (55 and 57). In some embodiments, strips 1050s of the dielectric layer 1050 separates the holes 1050h from one another. For example, the strips 1050s of the dielectric layer 1050 cover the first and second branch portions (51 and 53 labeled in FIG. 7B).

Referring to FIGS. 8C-8D, the data storage layers 1051 may be formed in the holes 1050h and line the inner sidewalls of the dielectric layer 1050. The step in FIG. 8C may correspond to the step described in FIG. 7C, so the details of the formation of the data storage layers 1051 are not repeated again for the sake of brevity. In the top-down view, two opposing sides (e.g., the upper side and the lower side) of the respective data storage layer 1051 are in direct contact with the neighboring third and fourth branch portions (55 and 57). As mentioned in FIG. 7C, the other two opposing sides (e.g., the left side and the right side) of the respective data storage layer 1051 may be in direct contact with the neighboring first and second branch portions (51 and 53) on the underlying odd-number tier. Subsequently, the bit lines 105B may be formed in the holes 1050h. The step in FIG. 8D may correspond to the step described in FIG. 7D, so the details of the formation of the bit lines 105B are not repeated again herein.

FIGS. 9A-9D and FIGS. 10A-10D are schematic partial cross-sectional views of intermediate stages of forming a memory cell array of a memory device taken along different directions according to some embodiments. Unless specified otherwise, the materials and the formation methods of the components in these embodiments are essentially the same as the like components, which are denoted by like reference numerals in the embodiments shown in FIGS. 7A-7D and FIGS. 8A-8D. The details regarding the materials of the components may thus be found in the discussion of the embodiments shown in FIGS. 7A-7D and FIGS. 8A-8D.

Referring to FIGS. 9A and 10A, the word lines 105W on the odd-numbered tiers 110O and on the even-numbered tiers 110E are alternately formed in the dielectric material 1050'. For example, the word lines 105W on the odd-numbered tier 110O including the first and second branch portions (51 and 53) and the first and second common connections (52 and 54 labeled in FIG. 5A) are formed in an odd-numbered sublayer 1050O of the dielectric material 1050'. The word lines 105W on the even-numbered tier 110E including the third and fourth branch portions (55 and 57) and the third and fourth common connections (56 and 58 labeled in FIG. 5B) are formed in an even-numbered sublayer 1050E of the dielectric material 1050', where the even-numbered sublayers 1050E and the odd-numbered sublayers 1050O are alternately stacked upon one another in the third direction D3 (e.g., Z direction). The materials and formation of the word lines 105W may be similar to those of the word lines 105W described in FIGS. 7A and 8A.

The cross-sectional view of FIG. 9A is taken along the lengthwise direction of the third and fourth branch portions (55 and 57). As can be seen in FIG. 9A, the third branch portion 55 on the even-numbered tier 110E extends along the section direction D2. The first and second branch portions (51 and 53) may be interleaved with one another and extend along the first direction D1, and thus the first and second branch portions (51 and 53) in FIG. 9A exhibit a plurality of blocks on the odd-numbered tier 110O. The cross-sectional view of FIG. 10A is taken along the lengthwise direction of the first and second branch portions (51 and 53), and thus the first and second branch portions (51 and 53) on the odd-numbered tier 110O extending along the first direction D1 are shown. The third and fourth branch portions (55 and 57) may be interleaved with one another and extend along the second direction D2, and thus the third and fourth branch portions (55 and 57) in FIG. 10A exhibit a plurality of blocks on the even-numbered tier 110E.

Referring to FIGS. 9B and 10B and with reference to FIGS. 9A and 10A, the portions of the dielectric material 1050' are removed to form the dielectric layer 1050 with the holes 1050h. The respective hole 1050h may penetrate through all of the odd-numbered tiers 110O and the even-numbered tiers 110E in the third direction D3. The forming process of the holes 1050h may be similar to the process described in FIGS. 7B and 8B. For example, the holes 1050h are formed in the dielectric material 1050' at the locations that are not covered by the branch portions of the word lines 105W on both of the odd-numbered and even-numbered tiers (110O and 110E). Although FIGS. 9B and 10B illustrate partial views of the memory device, it should be understood that the holes 1050h may extend to accessibly expose at least a portion of the drain electrodes of the devices for connection of the subsequently formed bit lines.

In the cross-sectional view of FIG. 9B, portions of the odd-numbered sublayer 1050O and the underlying even-numbered sublayers 1050E of the dielectric layer 1050 separate the first and second branch portions (51 and 53) from the third branch portion 55. The inner sidewall 1050w may be substantially aligned with the sidewalls (51w and 53w) of the first and second branch portions (51 and 53). In the other cross-sectional view of FIG. 10B, portions of the odd-numbered sublayer 1050O and the underlying even-numbered sublayers 1050E of the dielectric layer 1050 separate the first branch portion 51 from the third and fourth branch portions (55 and 57). The inner sidewall 1050w may be substantially aligned with the sidewalls (55w and 57w) of the third and fourth branch portions (55 and 57). In some embodiments, the word lines 105W on the odd-numbered tier 110O may be electrically isolated from the word lines 105W on the even-numbered tiers 110E.

Referring to FIGS. 9C and 10C, the data storage layers 1051 may be formed in the holes 1050h of the dielectric layer 1050. The materials and the forming process of the data storage layers 1051 may be similar to those of the data storage layers 1051 described in FIGS. 7C and 8C. For example, the inner sidewalls 1050w of the dielectric layer 1050 that define the holes 1050h are covered by the data storage layers 1051. In the cross-sectional view of FIG. 9C, the inner sidewalls 1050w of the dielectric layer 1050 and the sidewalls (51w and 53w) of the first and second branch portions (51 and 53) on the odd-numbered tier 110O are in direct contact with the data storage layers 1051. In the cross-sectional view of FIG. 10C, the inner sidewalls 1050w of the dielectric layer 1050 and sidewalls (55w and 57w) of the third and fourth branch portions (55 and 57) on the even-numbered tier 110E are in direct contact with the data storage layers 1051.

Referring to FIGS. 9D and 10D, conductive pillars may be formed in the holes 1050h to serve as the bit lines 105B. The bit lines 105B may extend in the third direction D3 and pass through all of the odd-numbered tiers 110O and the even-numbered tiers 110E. It should be understood that the third branch portion 55 and the bit lines 105B in FIG. 9D are not located in a same cross-section, the first branch portion 51 and the bit lines 105B in FIG. 10D are also not located in a same cross-section, and these elements are drawn together in a same cross-sectional view for ease of description only. The data storage layer 1051 in the respective hole 1050h may be sandwiched between the word lines 105W and the bit lines 105B on both of the odd-numbered tier 110O and the even-numbered tier 110E. The data storage layer 1051 in the respective hole 1050h may also separate the corresponding bit line 105B from the dielectric layer 1050 formed in the space between the word lines 105W on the odd-numbered tier 110O and the word lines 105W on the even-numbered tier 110E.

Figure 11:
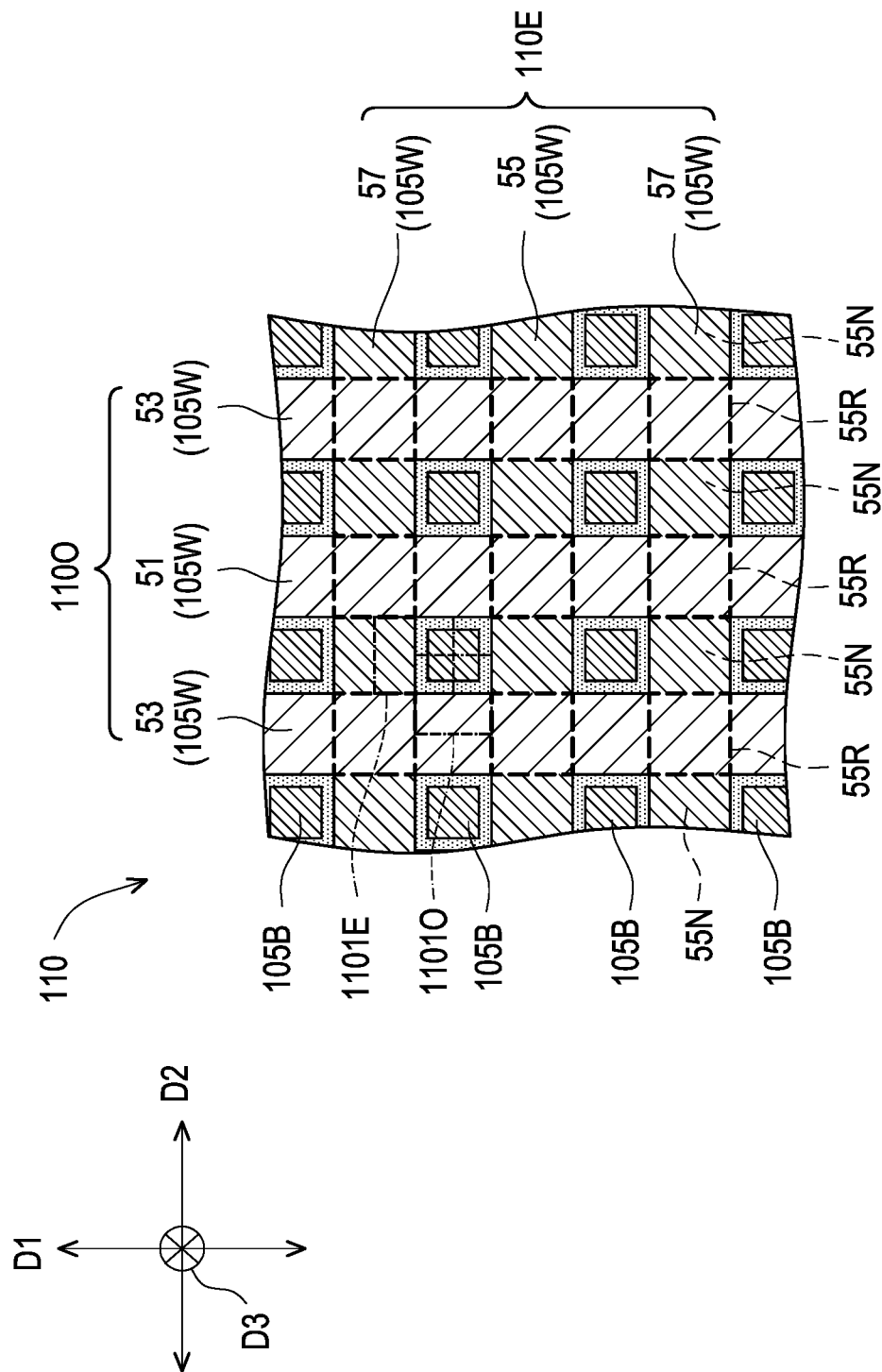
FIG. 11 is a schematic partial top view of stacked tiers of a memory cell array of a memory device according to some embodiments.

FIG. 11 is a schematic partial top view of stacked tiers of a memory cell array of a memory device according to some embodiments. It should be understood that the dielectric layer (labeled as 1050 in FIGS. 7D and 8D) is not shown for ease of description and illustration. Throughout the various views and illustrative embodiments, like reference numbers are used to designate like elements.

Referring to FIG. 11, the first and second branch portions (51 and 53) of the word lines 105W on the odd-numbered tier 110O are alternately arranged in parallel and extend in the first direction D1. The third and fourth branch portions (55 and 57) of the word lines 105W on the even-numbered tier 110E are also alternately arranged in parallel and extend in the second direction D2. The bit lines 105B are arranged between the word lines 105W and extend in the third direction D3. In the top-down view, the first and second branch portions (51 and 53) on the odd-numbered tier 110O and the third and fourth branch portions (55 and 57) on the even-numbered tier 110E may form a checkerboard pattern, e.g., repeats of an overlapping region 55R and an non-overlapping region 55N in both first and second directions (D1 and D2). For example, the overlapping regions 55R are the areas which an orthogonal projection area of the word lines 105W on the odd-numbered tier 110O overlaps an orthogonal projection area of the word lines 105W on the even-numbered tier 110E. For example, the overlapping regions 55R may be separated from one another by the dielectric layer (labeled as 1050 in FIGS. 7D and 8D). The non-overlapping regions 55N may be the areas which an orthogonal projection area of the word lines 105W on the odd-numbered tier 110O does not overlap an orthogonal projection area of the word lines 105W on the even-numbered tier 110E.

Since the word lines 105W on the odd-numbered tier 110O have the orientation different from the orientation of the word lines 105W on the even-numbered tier 110E, the overlapping regions 55R and the non-overlapping regions 55N are alternately arranged in the top-down view. As compared with a memory cell array with the aligned word lines on all tiers, the memory cell array 110 may have less overlapping regions 55R. In the cases where the memory cell array having the aligned word lines on all tiers, the cell-to-cell spacing is the thickness of the dielectric layer between two neighboring tiers. In the illustrated embodiment, the spacing between the memory cell 1101O on the odd-numbered tier 110O and the neighboring memory cell 1101E on the even-numbered tier 110E may be greater, as compared with a memory cell array with the aligned word lines on all tiers. For example, the spacing between the memory cell 1101O and the memory cell 1101E is about a square root of a sum of squares of the thickness of the dielectric layer and the diameter of the bit line 105W. As mentioned above, the coupling effect becomes worse if the word lines are aligned and extend in parallel through all tiers of the memory cell array. The memory cell array 110 including the word lines on the odd-numbered tiers 110O angularly offset from the word lines on the even-numbered tiers 110E is configured to reduce the overlapping regions and the cell-to-cell spacing between adjacent tiers, thereby reducing voltage coupling between stacked tiers.

Figure 12A:
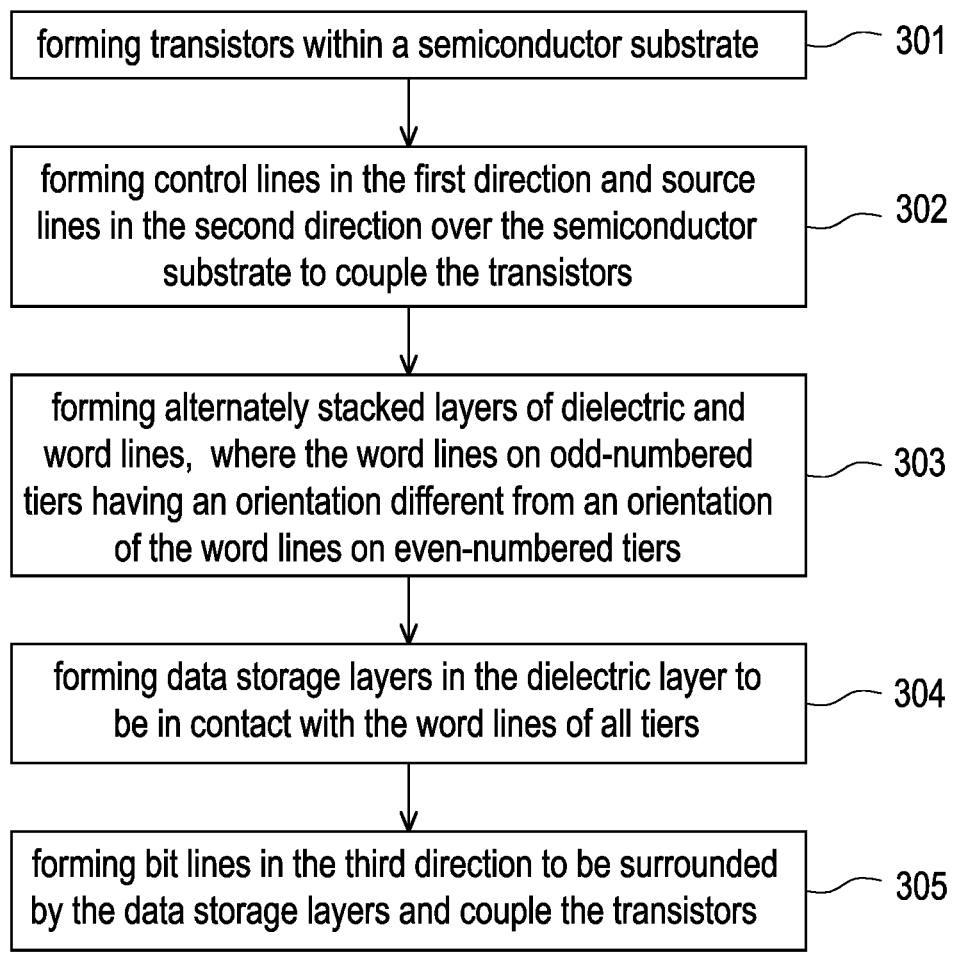
FIGS. 12A-12B are flow charts illustrating methods of manufacturing a semiconductor structure according to some embodiments.
Figure 12B:
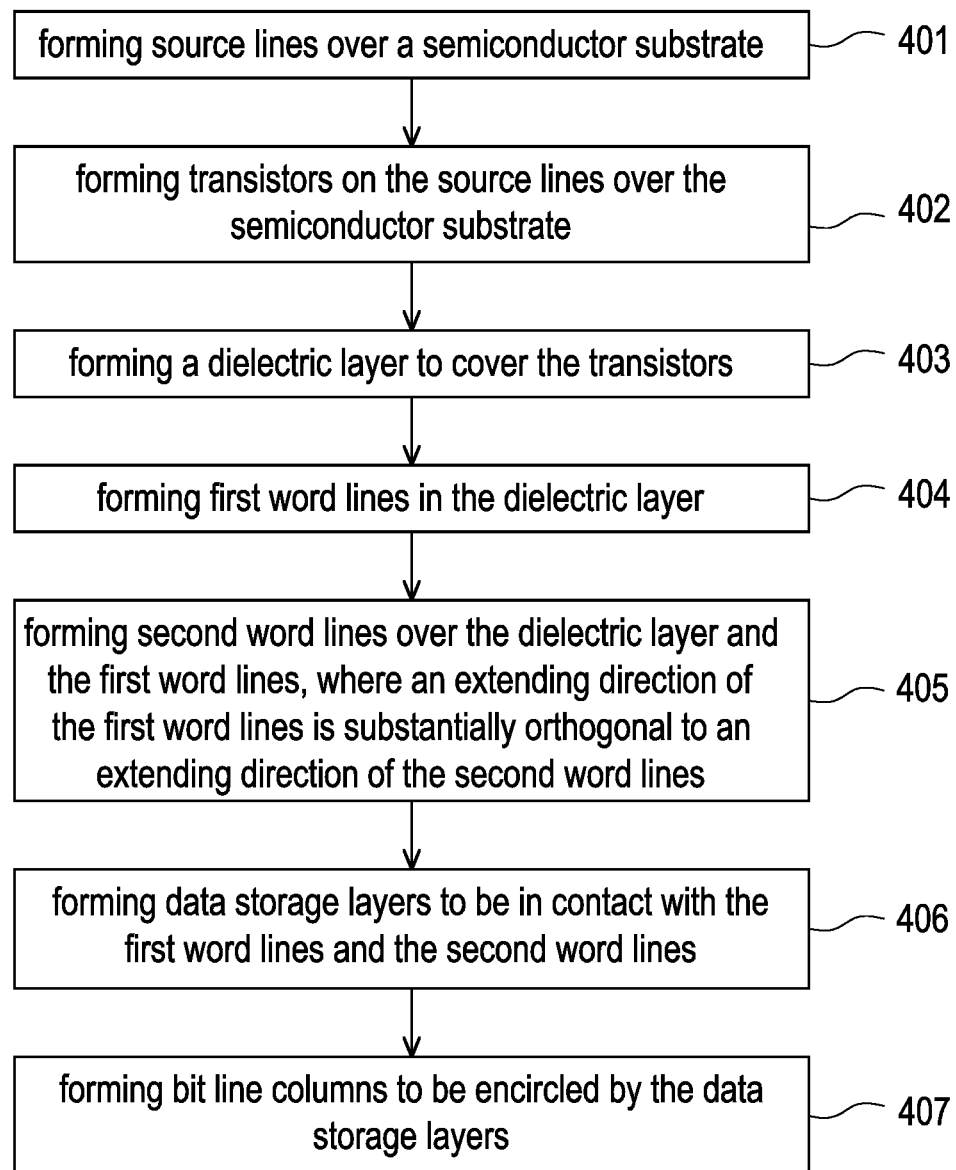

FIGS. 12A-12B are flow charts illustrating methods of manufacturing a semiconductor structure according to some embodiments. It will be appreciated that although the methods 300 and 400 are illustrated and described below as a series of steps, the illustrated ordering of such steps are not to be interpreted in a limiting sense. For example, some steps occur in different orders and/or concurrently with other steps apart from those illustrated and/or described herein. In addition, not all illustrated steps may be required to implement one or more aspects or embodiments of the description herein. Further, one or more of the steps depicted herein may be carried out in one or more separate acts and/or phases.

Referring to FIG. 12A, at step 301, a plurality of transistors (e.g., 104M) may be formed within a semiconductor substrate (e.g., 102). Next, at step 302, a plurality of control lines (e.g., 105C) extending in the first direction and a plurality of sources lines (e.g., 105S) extending in the second direction may be formed over the semiconductor substrate to be electrically coupled to the transistors. FIGS. 1-2 show some embodiments corresponding to the steps 301-302.

At step 303, alternately stacked layers of dielectric and word lines are formed over the control lines and the word lines, where the word lines on odd-numbered tiers having an orientation different from an orientation of the word lines on even-numbered tiers. FIGS. 7A, 8A, 9A, and 10A show some embodiments corresponding to the step 303.

At step 304, a plurality of data storage layers may be formed in the holes of the dielectric layer to be in contact with the word lines of all tiers. FIGS. 7B-7C, 8B-8C, 9B-9C, and 10B-10C show some embodiments corresponding to the step 304. At step 305, a plurality of bit lines may be formed in the holes of the dielectric layer and extend in the third direction to be surrounded by the data storage layers and to couple the transistors. FIGS. 7D, 8D, 9D, and 10D show some embodiments corresponding to the step 305.

Referring to FIG. 12B, at step 401, a plurality of source lines (e.g., 105S) may be formed over a semiconductor substrate (e.g., 102). Next, at step 402, a plurality of transistors (e.g., 204M) may be formed on the source lines over the semiconductor substrate. At step 403, a dielectric layer (e.g., 106I) is formed to cover the transistors. FIG. 3 show some embodiments corresponding to the steps 401-403.

At step 404, a plurality of first word lines may be formed in the dielectric layer. FIGS. 7A, 9A, and 10A show some embodiments corresponding to the steps 404. At step 405, a plurality of second word lines may be formed over the dielectric layer and the first word lines, where an extending direction of the first word lines is substantially orthogonal to an extending direction of the second word lines. FIGS. 8A, 9A and 10A show some embodiments corresponding to the steps 405.

At step 406, a plurality of data storage layers may be formed to be in contact with the first word lines and the second word lines. FIGS. 7B-7C, 8B-8C, 9B-9C, and 10B-10C show some embodiments corresponding to the step 406. Next, at step 407, a plurality of bit line columns may be formed to be encircled by the data storage layer. FIGS. 7D, 8D, 9D, and 10D show some embodiments corresponding to the step 307. The manufacturing method described in the disclosure may be used to form any of a variety of nonvolatile memory devices, such as RRAM devices, PCRAM devices, CBRAM devices, MRAM device, FeRAM, or the like, while remaining within the scope of the present disclosure.

According to some embodiments, a memory device includes a plurality of transistors and a memory cell array disposed over and electrically coupled to the transistors. The memory cell array includes a plurality of word lines, a plurality of bit line columns, and a plurality of data storage layers interposed between the word lines and the bit line columns. A first portion of the word lines on odd-numbered tiers of the memory cell array is oriented in a first direction, and a second portion of the word lines on even-numbered tiers of the memory cell array is oriented in a second direction that is angularly offset from the first direction. The bit line columns pass through the odd-numbered tiers and the even-numbered tiers, and each of the bit line columns is encircled by one of the data storage layers.

According to some alternative embodiments, a semiconductor die includes a semiconductor substrate, an interconnect structure disposed over the semiconductor substrate, and a memory device embedded in the interconnect structure. The memory device includes a plurality of transistors, a plurality of first word lines, a plurality of second word lines, a plurality of bit lines, and a plurality of data storage layers. The first word lines are on a first tier and extending in a first direction, and the second word lines are on a second tier above the first tier and extend in a second direction that is substantially orthogonal to the first direction. The bit lines pass through the first tier and the second tier and extend in a third direction that is substantially orthogonal to the first direction and the second direction. The data storage layers separate the first word lines and the second word lines from the bit lines, and each of the bit lines is encircled by one of the data storage layers.

According to some alternative embodiments, a manufacturing method of a semiconductor structure includes at least the following steps. A plurality of first word lines is formed in a dielectric layer. A plurality of second word lines is formed over the dielectric layer and the first word lines, where an extending direction of the first word lines is substantially orthogonal to an extending direction of the second word lines. A data storage layer is formed to be in contact with the first word lines and the second word lines. A plurality of bit line columns is formed to be encircled by the data storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of transistors; and
   a memory cell array disposed over and electrically coupled to the transistors, and the memory cell array comprising:
   a plurality of word lines, a first portion of the word lines on odd-numbered tiers of the memory cell array being oriented in a first direction, and a second portion of the word lines on even-numbered tiers of the memory cell array being oriented in a second direction that is angularly offset from the first direction;
   a plurality of bit line columns passing through the odd-numbered tiers and the even-numbered tiers; and
   a plurality of data storage layers interposed between the word lines and the bit line columns, and each of the bit line columns being encircled by one of the data storage layers.

2. The memory device of claim 1, wherein the first direction is substantially orthogonal to the second direction.

3. The memory device of claim 1, wherein: the first portion or the second portion of the word lines comprises:
   a first branch portion connected together through a first common connection; and
   a second branch portion connected together though a second common connection that is substantially parallel to the first common connection.

4. The memory device of claim 3, wherein the first branch portion of the word lines is interleaved with the second branch portion of the word lines.

5. The memory device of claim 1, further comprising:
   a plurality of control lines extending in the first direction and electrically connected to gate electrodes of the transistors; and
   a plurality of source lines extending in the second direction and disposed below the control lines, the source lines electrically connected to source electrodes of the transistors.

6. The memory device of claim 1, wherein each of the transistors comprises a source electrode and the drain electrode vertically between the source electrode and the memory cell array, and the drain electrode of each of the transistors is connected to one of the bit line columns.

7. A semiconductor die, comprising:
   a semiconductor substrate;
   an interconnect structure disposed over the semiconductor substrate; and
   a memory device embedded in the interconnect structure and comprising:
   a plurality of transistors;
   a plurality of first word lines on a first tier and extending in a first direction;
   a plurality of second word lines on a second tier above the first tier and extending in a second direction that is substantially orthogonal to the first direction;
   a plurality of bit lines passing through the first tier and the second tier and extending in a third direction that is substantially orthogonal to the first direction and the second direction; and
   a plurality of data storage layers separating the first word lines and the second word lines from the bit lines, and each of the bit lines being encircled by one of the data storage layers.

8. The semiconductor die of claim 7, wherein the first word lines or the second word lines comprises:
   a first branch portion; and
   a second branch portion interleaved with the first branch portion, and the first branch portion and the second branch portion are connected to different common connections.

9. The semiconductor die of claim 7, wherein the first word lines or the second word lines comprises:
   a first branch portion connected together through a first common connection; and
   a second branch portion connected together through a second common connection that is parallel to the first common connection.

10. The semiconductor die of claim 9, wherein:
    one of the first word lines comprises a plurality of overlapping regions covered by the second word lines, and the overlapping regions are separated from one another by a dielectric layer of the interconnect structure.

11. The semiconductor die of claim 7, further comprising:
    a plurality of control lines extending in the first direction and electrically connected to the transistors; and
    a plurality of source lines extending in the second direction and disposed below the control lines, the source lines electrically connected to source electrodes of the transistors.

12. The semiconductor die of claim 7, wherein each of the transistors comprises a source electrode and a drain electrode stacked over the source electrode in the third direction.

13. The semiconductor die of claim 12, wherein:
    each of the transistors further comprises a gate electrode laterally offset from the source electrode and the drain electrode and extending in the first direction.

14. A manufacturing method of a semiconductor structure, comprising:
    forming a plurality of first word lines in a dielectric layer;
    forming a plurality of second word lines over the dielectric layer and the first word lines, wherein an extending direction of the first word lines is substantially orthogonal to an extending direction of the second word lines;
    forming data storage layers to be in contact with the first word lines and the second word lines; and
    forming a plurality of bit line columns, wherein each of the plurality of bit line columns to be encircled by one of the data storage layers.

15. The manufacturing method of claim 14, wherein forming the data storage layers comprises:
- removing columns of the dielectric layer to form a plurality of holes, wherein the holes are between the first word lines and also between the second word lines in a top view; and
- lining the holes with the data storage layers.

16. The manufacturing method of claim 15, wherein forming the bit line columns comprises:
- depositing a conductive material in the holes after the lining.

17. The manufacturing method of claim 14, wherein forming the first word lines comprises:
- forming a first branch portion and a second branch portion that are in parallel and interleaved, wherein the first branch portion and the second branch portion are connected to different common connections.

18. The manufacturing method of claim 14, further comprising:
- forming a plurality of transistors over a semiconductor substrate; and
- forming the dielectric layer to cover the transistors before forming the first word lines.

19. The manufacturing method of claim 18, wherein forming the transistors over the semiconductor substrate comprises:
- forming a plurality of control lines which serve as gate electrodes of the transistors before forming the first word lines.

20. The manufacturing method of claim 18, further comprising:
- forming a plurality of source lines before forming the transistors, wherein at least one of the transistors is formed on each of the source lines.

* * * * *